(12) United States Patent
Xu et al.

(10) Patent No.: US 8,987,779 B2
(45) Date of Patent: Mar. 24, 2015

(54) ELECTROSTATIC DISCHARGE PROTECTION DEVICE

(75) Inventors: Qi-An Xu, Hsinchu (TW); Chieh-Wei He, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 552 days.

(21) Appl. No.: 13/304,383

(22) Filed: Nov. 24, 2011

(65) Prior Publication Data
US 2013/0134479 A1    May 30, 2013

(51) Int. Cl.
   *H01L 29/73*   (2006.01)
   *H01L 27/02*   (2006.01)
   *H01L 29/74*   (2006.01)

(52) U.S. Cl.
   CPC ........ *H01L 27/0262* (2013.01); *H01L 29/7436* (2013.01)
   USPC .................................. 257/173; 257/E29.181

(58) Field of Classification Search
   CPC ..... H01L 29/73; H01L 23/60; H01L 27/0248; H01L 27/0262; H01L 27/0259; H01L 21/761; H01L 21/8249
   USPC .......................................... 257/173, E29.181
   See application file for complete search history.

(56) References Cited

U.S. PATENT DOCUMENTS

2011/0303947 A1*   12/2011   Salcedo et al.

* cited by examiner

*Primary Examiner* — Selim Ahmed
(74) *Attorney, Agent, or Firm* — Jianq Chyun IP Office

(57) ABSTRACT

An ESD protection device including second P-type wells, first P+-type doped regions, first N+-type doped regions and a P-type substrate having a first P-type well, an N-type well and an N-type deep well is provided. The second P-type wells are disposed in the N-type deep well. The first P+-type doped regions and the first N+-type doped regions are respectively disposed in the first P-type well, the N-type well and the second P-type wells in alternation. The first P+-type doped region in the N-type well and the N-type deep well are electrically connected to the first connection terminal. The doped regions in the first P-type well and the P-type substrate are electrically connected to the second connection terminal. The second P-type wells and the first N+-type doped regions therein form a diode string connected in series between the first N+-type doped region of the N-type well and the second connection terminal.

11 Claims, 4 Drawing Sheets

ELECTROSTATIC DISCHARGE PROTECTION DEVICE

BACKGROUND OF THE INVENTION

1. Field of the Invention

The invention relates to a protection device. Particularly, the invention relates to an electrostatic discharge (ESD) protection device.

2. Description of Related Art

Electrostatic discharge (ESD) is usually a main reason to cause electrostatic overstress of an integrated circuit (IC) or permanent damage thereof, and a commonly-used method is to add an ESD protection device between a core circuit and a pad to prevent ESD damage. In various ESD protection devices, a diode-triggered silicon controlled rectifier (DTSCR) is widely applied in various types of ICs due to its characteristics of low trigger voltage and fast turn-on speed.

FIG. 1 is cross-sectional view of a conventional DTSCR. Referring to FIG. 1, the DTSCR 100 includes a P-type substrate 110 and a P-type well region 120 and N-type well regions 131-134 configured in the P-type substrate 110. Moreover, P+-type doped regions 141-145 and N+-type doped regions 151-155 are alternately configured in the P-type well region 120 and the N-type well regions 131-134. In view of electrical connection, a plurality of diodes formed by the P+-type doped regions 142-145 and the N-type well regions 131-134 are connected in series between a pad 101 and a ground wire GND1. Moreover, the P+-type doped region 141 and the N+-type doped region 151 in the P-type well region 120 and a P+-type doped region 146 in the P-type substrate 110 are all electrically connected to the ground wire GND1.

In this way, a layout structure of the DTSCR 100 is equivalent to a circuit diagram shown in FIG. 2. As shown in FIG. 2, the DTSCR 100 includes a silicon controlled rectifier circuit composed of a PNP transistor MP21 and an NPN transistor MN2, PNP transistors MP22-MP24 connected in Darlington configuration and a resistor R2. In operation, ESD events can be classified in to several modes, for example, PS mode and NS mode. Wherein, the PS mode is the case when a positive pulse signal is applied for the pad 101 with the ground wire GND1 is grounded, and the NS mode is the case when a negative pulse signal is applied for the pad 101 with the ground wire GND1 is grounded. When an electrostatic signal from the pad 101 is a positive pulse signal, i.e. when a PS mode ESD event occurs, the PNP transistors MP22-MP24 contribute a tiny current to trigger the silicon controlled rectifier circuit composed of the PNP transistor MP21 and the NPN transistor MN2. In this way, the positive pulse signal from the pad 101 can be guided to the ground wire GND1 through the silicon controlled rectifier circuit.

However, when the electrostatic signal from the pad 101 is a negative pulse signal, i.e. when an NS mode ESD event occurs, the DTSCR 100 cannot provide a discharge path. In other words, the DTSCR 100 does not have an NS mode ESD protection function, so that the IC has to be additionally configured with an inverse diode D2. Moreover, when a core circuit 102 normally operates, the diode string formed by the N-type well regions 131-134 and the P+-type doped regions 142-145 is biased under a forward bias. Now, the equivalent PNP transistors MP22-MP24 in the DTSCR 100 produce a vertical leakage path, which may cause a large leakage current of the DTSCR 100.

In other words, the DTSCR 100 cannot satisfy a condition of low leakage current required by a high-speed transmission device, so that it cannot be applied in the high-speed transmission device. Moreover, the DTSCR 100 does not have the NS mode ESD protection function.

SUMMARY OF THE INVENTION

Accordingly, the invention is directed to an electrostatic discharge (ESD) protection device, in which P-type well regions and N+-type doped regions in an N-type deep well region are used to form a diode string to block a vertical leakage path. In this way, the ESD protection device of the invention can be applied in a high-speed transmission device.

The invention is directed to an ESD protection device, in which an N-type deep well region and a P-type substrate are used to form an inverse diode. In this way, the ESD protection device of the invention has a PS mode and an NS mode ESD protection functions.

The invention provides an electrostatic discharge (ESD) protection device having a first connection terminal and a second connection terminal, and includes a P-type substrate, M second P-type well regions, a plurality of first P+-type doped regions and a plurality of first N+-type doped regions, where M is an integer greater than 1. The P-type substrate has a first P-type well region, an N-type well region and an N-type deep well region, where the N-type deep well region is electrically connected to the first connection terminal, and the P-type substrate is electrically connected to the second connection terminal. The M second P-type well regions are disposed in the N-type deep well region. The first P+-type doped regions are respectively disposed in the first P-type well region, the N-type well region and the second P-type well regions. The first N+-type doped regions are respectively disposed in the first P-type well region, the N-type well region and the second P-type well regions, and the first N+-type doped regions and the first P+-type doped regions are configured in alternation.

In an embodiment of the invention, the first P+-type doped region and the first N+-type doped region in the first P-type well region are electrically connected to the second connection terminal. The first P+-type doped region and the first N+-type doped region in the N-type well region are electrically connected to the first connection terminal and the first P+-type doped region of a $1^{st}$ second P-type well region. The first N+-type doped region of an $i^{th}$ second P-type well region is electrically connected to the first P+-type doped region in an $(i+1)^{th}$ second P-type well region, and the first N+-type doped region of an $M^{th}$ second P-type well region is electrically connected to the second connection terminal, where i is an integer and $1 \leq i \leq (M-1)$.

In an embodiment of the invention, the N-type well region is located between the first P-type well region and the N-type deep well region, and the N-type well region is in contact with the first P-type well region, and the N-type well region is not in contact with the N-type deep well region.

In an embodiment of the invention, the second P-type well regions are not in contact with each other.

In an embodiment of the invention, the ESD protection device further includes a second N+-type doped region. The second N+-type doped region is disposed in the N-type deep well region, and is adjacent to the $M^{th}$ second P-type well region, and the N-type deep well region is electrically connected to the first connection terminal through the second N+-type doped region.

In an embodiment of the invention, the ESD protection device further includes a second P+-type doped region. The second P+-type doped region is disposed in the P-type substrate, and is adjacent to the N-type deep well region, and the P-type substrate is electrically connected to the second connection terminal through the second P+-type doped region.

The invention provides an electrostatic discharge (ESD) protection device having a first connection terminal and a second connection terminal, and includes a P-type substrate, a second P-type well region, a plurality of first P+-type doped regions and a plurality of first N+-type doped regions. The P-type substrate has a first P-type well region, an N-type well region and an N-type deep well region, where the N-type deep well region is electrically connected to the first connection terminal, and the P-type substrate is electrically connected to the second connection terminal. The second P-type well region is disposed in the N-type deep well region. The first P+-type doped regions are respectively disposed in the first P-type well region, the N-type well region and the second P-type well region. The first N+-type doped regions are respectively disposed in the first P-type well region, the N-type well region and the second P-type well region, and the first N+-type doped regions and the first P+-type doped regions are configured in alternation.

In an embodiment of the invention, the first P+-type doped region and the first N+-type doped region in the first P-type well region are electrically connected to the second connection terminal. The first P+-type doped region and the first N+-type doped region in the N-type well region are electrically connected to the first connection terminal and the first P+-type doped region of the second P-type well region. The first N+-type doped region of the second P-type well region is electrically connected to the second connection terminal.

According to the above descriptions, in the invention, the N-type deep well region is disposed in the P-type substrate, and a diode string formed by the P-type well regions and the N+-type doped regions are configured in the N-type deep well region. Moreover, the N-type deep well region is electrically connected to the first connection terminal, and the P-type substrate is electrically connected to the second connection terminal. In this way, when an ESD event is occurred, the ESD protection device can trigger the internal silicon controlled rectifier circuit through the diode string in the N-type deep well region, or conduct the internal inverse diode. Moreover, when a core circuit normally operates, the N-type deep well region is connected to a pad through the first connection terminal of the device, so as to be biased under a reverse bias. In this way, the ESD protection device may have both of the PS mode and the NS mode ESD protection functions, and can be applied in a high-speed transmission device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
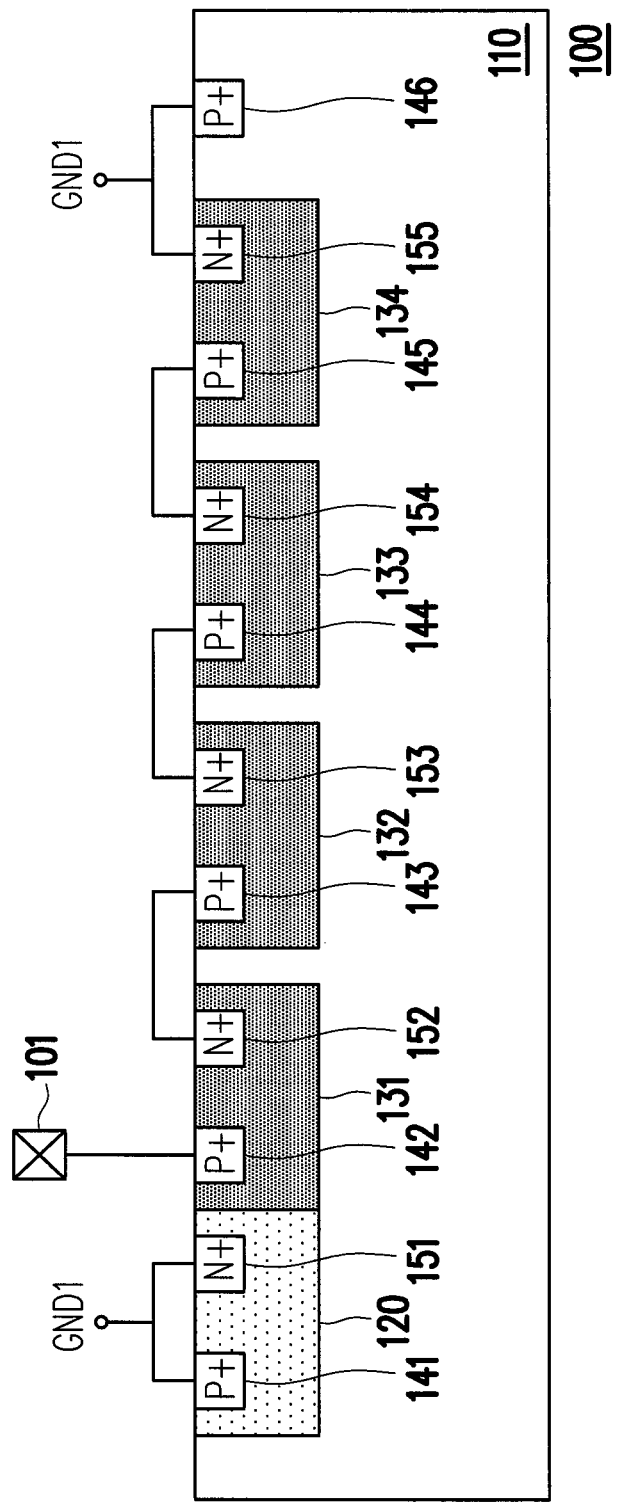
FIG. 1 is cross-sectional view of a conventional diode-triggered silicon controlled rectifier (DTSCR).
Figure 2:
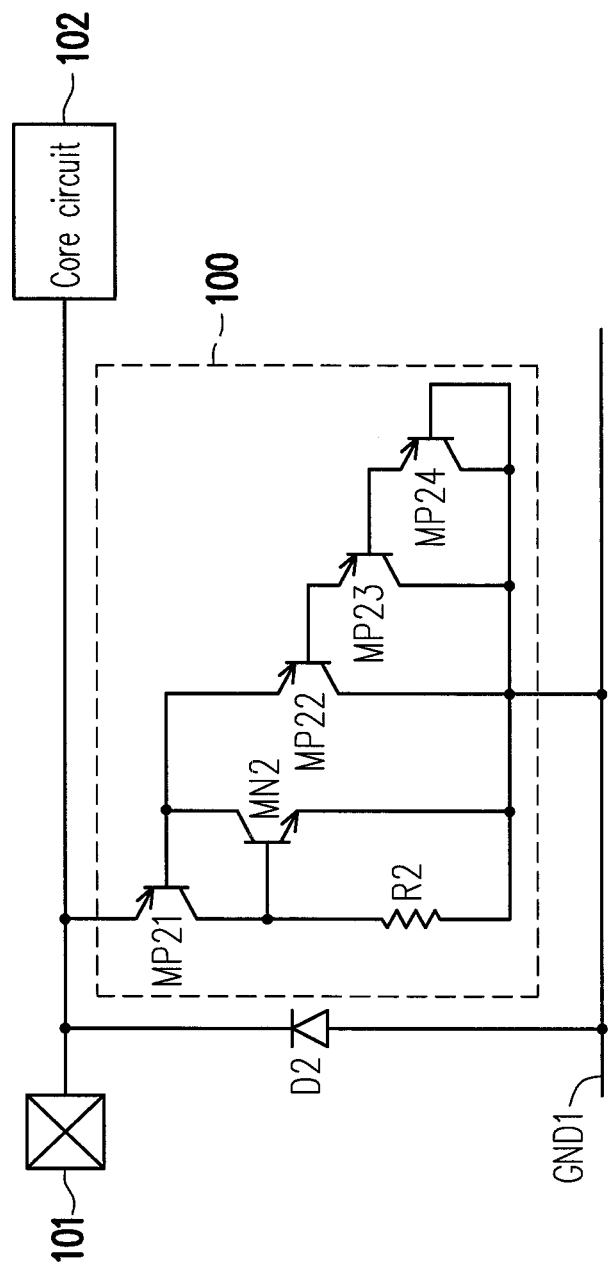
FIG. 2 is an equivalent circuit diagram of the conventional DTSCR of FIG. 1.
Figure 3:
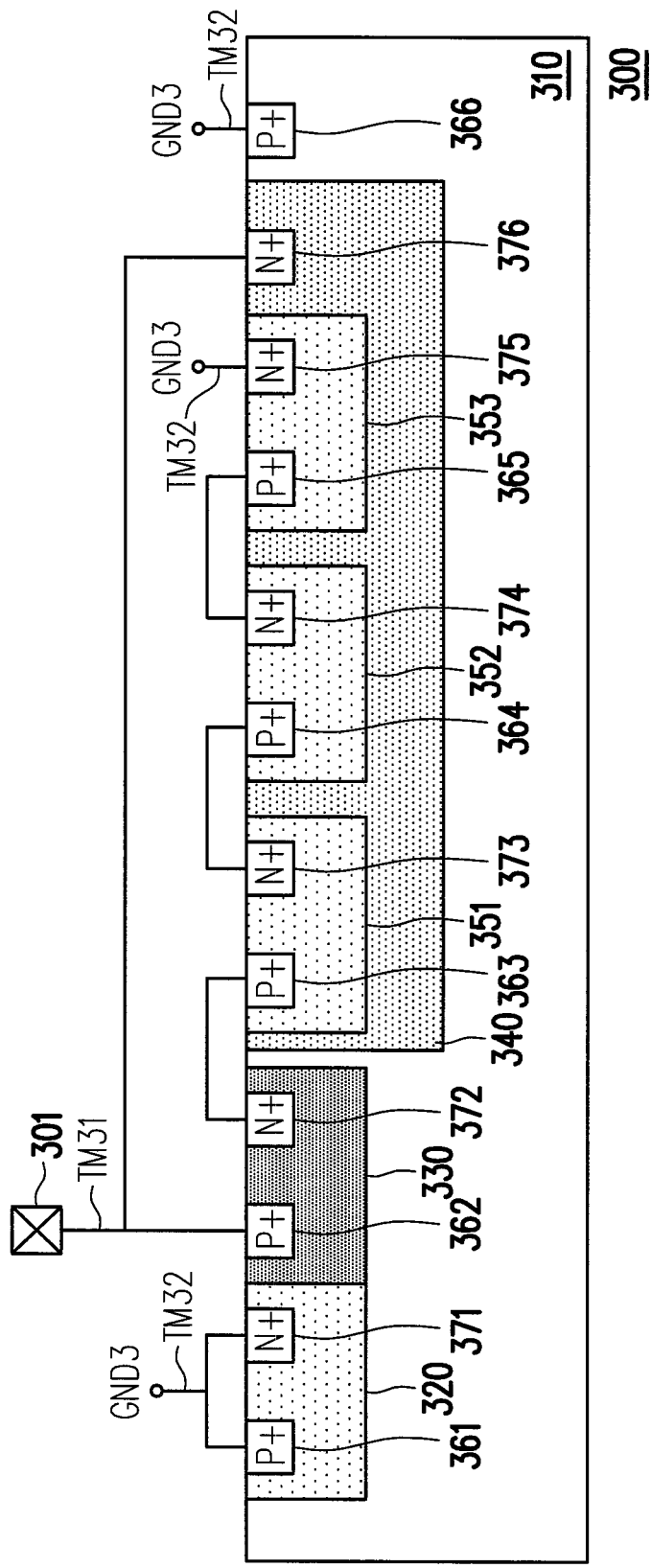
FIG. 3 is a cross-sectional view of an electrostatic discharge (ESD) protection device according to an embodiment of the invention.

FIG. 3 is a cross-sectional view of an electrostatic discharge (ESD) protection device according to an embodiment of the invention. The ESD protection device 300 has a first connection terminal TM31 and a second connection terminal TM32, and for simplicity's sake, the same second connection terminal TM32 is indicated at different places. Referring to FIG. 3, the ESD protection device 300 includes a P-type substrate 310, a P-type well region 320, an N-type well region 330, an N-type deep well region 340, a plurality of P-type well regions 351-353, a plurality of P+-type doped regions 361-366 and a plurality of N+-type doped regions 371-376.

In view of configuration, the P-type well region 320, the N-type well region 330 and the N-type deep well region 340 are disposed in the P-type substrate 310. Moreover, the N-type well region 330 is located between the P-type well region 320 and the N-type deep well region 340. The N-type well region 330 is in contact with the P-type well region 320, and the N-type well region 330 is not in contact with the N-type deep well region 340. Moreover, the P-type well regions 351-353 are disposed in the N-type deep well region 340, and the P-type well regions 351-353 are not in contact with each other.

On the other hand, the P-type well region 320, the N-type well region 330 and the P-type well regions 351-353 disposed in the N-type deep well region 340 respectively include a P+-type doped region and an N+-type doped region, for example, the P-type well region 320 has the P+-type doped region 361 and the N+-type doped region 371, and the N-type well region 330 has the P+-type doped region 362 and the N+-type doped region 372. Moreover, the P+-type doped regions 361-365 and the N+-type doped regions 371-375 in the P-type well region 320, the N-type well region 330 and the P-type well regions 351-353 are disposed in alternation.

In view of electrical connection, the P+-type doped region 361 and the N+-type doped region 371 in the P-type well region 320 are electrically connected to the second connection terminal TM32. The P+-type doped region 362 and the N+-type doped region 372 in the N-type well region 330 are electrically connected to the first connection terminal TM31 and the P+-type doped region 363 in the P-type well region 351. Regarding the doped regions in the P-type well regions 351-353, the N+-type doped region 373 is electrically connected to the P+-type doped region 364, the N+-type doped region 374 is electrically connected to the P+-type doped region 365, and the N+-type doped region 375 is electrically connected to the second connection terminal TM32.

Moreover, the N+-type doped region 376 is disposed in the N-type deep well region 340 and is adjacent to the P-type well region 353. Furthermore, the N+-type doped region 376 is electrically connected to the first connection terminal TM31. In other words, the N-type deep well region 340 is electrically connected to the first connection terminal TM31 through the N+-type doped region 376. On the other hand, the P+-type doped region 366 is disposed in the P-type substrate 310, and is adjacent to the N-type deep well region 340. Moreover, the P+-type doped region 366 is electrically connected to the second connection terminal TM32. In other words, the P-type substrate 310 is electrically connected to the second connection terminal TM32 through the P+-type doped region 366.

Figure 4:
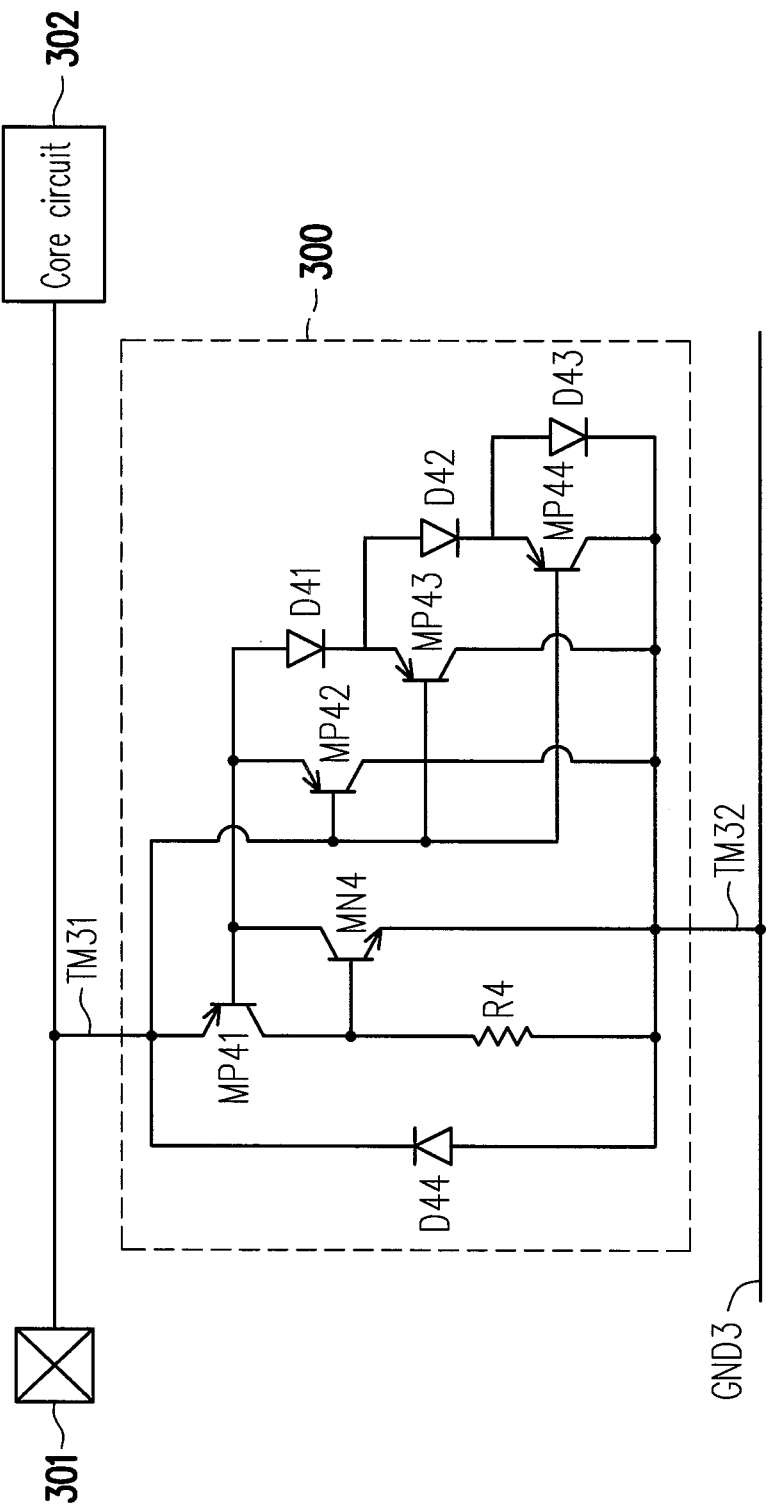
FIG. 4 is an equivalent circuit diagram of the ESD protection device of FIG. 3.

FIG. 4 is an equivalent circuit diagram of the ESD protection device of FIG. 3. Referring to FIG. 3 and FIG. 4, in an actual application, the two connection terminals TM31 and TM32 of the ESD protection device 300 can be respectively connected to a pad 301 and a ground wire GND3 of an integrated circuit (IC), and the ESD protection device 300 is used to prevent the ESD event from damaging a core circuit 302. In view of a layout structure, the N+-type doped region 371, the P-type well region 320 and the N-type well region 330 form a horizontal NPN transistor MN4, and the P+-type doped region 362, the N-type well region 330 and the P-type substrate 310 form a vertical PNP transistor MP41. In this way, the NPN transistor MN4 and the PNP transistor MP41 form a silicon controlled rectifier circuit. Moreover, a resistor R4 is an equivalent resistor contributed by the P-type well region 320.

Moreover, the P-type well region 351, the N-type deep well region 340 and the P-type substrate 310 form a vertical PNP transistor MP42. Similarly, the P-type well region 352, the N-type deep well region 340 and the P-type substrate 310 form a vertical PNP transistor MP43, and the P-type well region 353, the N-type deep well region 340 and the P-type substrate 310 form a vertical PNP transistor MP44. On the other hand, the P-type well region 351 and the N+-type doped region 373 form a diode D41, the P-type well region 352 and the N+-type doped region 374 form a diode D42, and the P-type well region 353 and the N+-type doped region 375 form a diode D43. Namely, the P-type well regions 351-353 and the N+-type doped regions 373-375 in the N-type deep well region 340 form a diode string, i.e. the diode string formed by the diodes D41-D43 connected in series. Moreover, the N-type deep well region 340 and the P-type substrate 310 form an inverse diode D44.

In other words, the P-type well region 320, the N-type well region 330 and the doped regions 361-362 and 371-372 are mainly used to form the silicon controlled rectifier circuit, and the diode string in the N-type deep well region 340 is used to trigger the silicon controlled rectifier circuit. Therefore, the ESD protection device 300 is a diode-triggered silicon controlled rectifier (DTSCR).

In an actual application, when an electrostatic signal from the pad 301 is a positive pulse signal, i.e. when a PS mode ESD event occurs, the diode string provides a tiny current to trigger the silicon controlled rectifier circuit composed of the NPN transistor MN4 and the PNP transistor MP41. In this way, the positive pulse signal from the pad 301 can be guided to the ground wire GND3 through a large current path provided by the silicon controlled rectifier circuit. Moreover, when the electrostatic signal from the pad 301 is a negative pulse signal, i.e. when an NS mode ESD event occurs, the diode D44 is conducted to provide a path for conducting the negative pulse signal to the ground wire GND3. In other words, in an actual application, the ESD protection device 300 may have the PS mode and the NS mode ESD protection functions without additionally set an inverse diode.

Moreover, regarding the layout structure of the ESD protection device 300, the equivalent PNP transistors MP42-MP44 do not form a Darlington configuration. Moreover, the diode string formed by the P-type well regions and the N+-type doped regions is disposed in the N-type deep well region 340, and the N-type deep well region 340 is electrically connected to the pad 301. Therefore, when the core circuit 302 normally operates, the N-type deep well region 340 is biased under a reverse bias, which blocks a vertical leakage path. Namely, when the core circuit 302 normally operates, the equivalent PNP transistors MP42-MP44 in the ESD protection device 300 do not produce a leakage path. In other words, when the core circuit 302 normally operates, the ESD protection device 300 does not generate a large leakage current. Therefore, the ESD protection device 300 can satisfy a condition of low leakage current required by a high-speed transmission device, so that it can be applied in the high-speed transmission device.

It should be noticed that the diode string of the embodiment of FIG. 3 is composed of three diodes D41-D42, though the invention is not limited thereto, and those skilled in the art can also arbitrarily modify the number of diodes used to form the diode string according to a design requirement. For example, the diode string in the N-type deep well region 340 can be formed by M diodes connected in series, where M is an integer greater than 1. Now, M P-type well regions are configured in the N-type deep well region 340. Moreover, in view of electrical connection, the P+-type doped region of a $1^{st}$ P-type well region is electrically connected to the N+-type doped region 372 in the N-type well region 330. The N+-type doped region of an $i^{th}$ P-type well region is electrically connected to the P+-type doped region in an $(i+1)^{th}$ P-type well region, and the N+-type doped region of an $M^{th}$ P-type well region is electrically connected to the second connection terminal TM32, where i is an integer and $1 \leq i \leq (M-1)$.

Besides, in case of a low voltage application, the diode string in the N-type deep well region 340 can be formed by a single diode. Now, the N-type deep well region 340 is configured with a single P-type well region. Moreover, regarding the single P-type well region in the N-type deep well region 340, the P+-type doped region therein is electrically connected to the N+-type doped region 372 in the N-type well region 330, and the N+-type doped region therein is electrically connected to the second connection terminal TM32.

In summary, in the invention, the N-type deep well region is disposed in the P-type substrate, and the diode string formed by the P-type well regions and the N+-type doped regions are configured in the N-type deep well region. In this way, when an ESD event is occurred, the ESD protection device can trigger the internal silicon controlled rectifier circuit through the diode string in the N-type deep well region, or conduct the internal inverse diode. Moreover, when the core circuit normally operates, the N-type deep well region is connected to a pad through the first connection terminal of the device, so as to be biased under a reverse bias. In this way, generation of the vertical leakage current is blocked, so as to suppress generation of the leakage current of the ESD protection device. In other words, the ESD protection device may have both of the PS mode and the NS mode ESD protection functions, and can be applied in a high-speed transmission device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electrostatic discharge (ESD) protection device, having a first connection terminal and a second connection terminal, and comprising:
   a P-type substrate, having a first P-type well region, an N-type well region and an N-type deep well region, wherein the N-type deep well region is electrically connected to the first connection terminal, and the P-type substrate is electrically connected to the second connection terminal;
   M second P-type well regions, disposed in the N-type deep well region, wherein M is an integer greater than 1;

a plurality of first P+-type doped regions, respectively disposed in the first P-type well region, the N-type well region and the second P-type well regions; and a plurality of first N+-type doped regions, respectively disposed in the first P-type well region, the N-type well region and the second P-type well regions, and the first N+-type doped regions and the first P+-type doped regions being configured in alternation, wherein a diode string is formed through the second P-type well regions and the first N+-type doped regions in the second P-type well regions, a silicon controlled rectifier circuit is formed through the P-type substrate, the N-type well region, the first P+-type doped region in the N-type well region, the first P-type well region and the first N+-type doped region in the first P-type well region, and the diode string is configured to trigger the silicon controlled rectifier circuit.

2. The ESD protection device as claimed in claim 1, wherein the first P+-type doped region and the first N+-type doped region in the first P-type well region are electrically connected to the second connection terminal, the first P+-type doped region and the first N+-type doped region in the N-type well region are electrically connected to the first connection terminal and the first P+-type doped region of a $1^{st}$ second P-type well region, the first N+-type doped region of an $i^{th}$ second P-type well region is electrically connected to the first P+-type doped region in an $(i+1)^{th}$ second P-type well region, and the first N+-type doped region in an $M^{th}$ second P-type well region is electrically connected to the second connection terminal, wherein i is an integer and $1 \leq i \leq (M-1)$.

3. The ESD protection device as claimed in claim 1, wherein the N-type well region is located between the first P-type well region and the N-type deep well region, the N-type well region is in contact with the first P-type well region, and the N-type well region is not in contact with the N-type deep well region.

4. The ESD protection device as claimed in claim 1, wherein the second P-type well regions are not in contact with each other.

5. The ESD protection device as claimed in claim 1, further comprising:

a second N+-type doped region, disposed in the N-type deep well region, and adjacent to the $M^{th}$ second P-type well region, wherein the N-type deep well region is electrically connected to the first connection terminal through the second N+-type doped region.

6. The ESD protection device as claimed in claim 1, further comprising:

a second P+-type doped region, disposed in the P-type substrate, and adjacent to the N-type deep well region, wherein the P-type substrate is electrically connected to the second connection terminal through the second P+-type doped region.

7. An electrostatic discharge (ESD) protection device, having a first connection terminal and a second connection terminal, and comprising:

a P-type substrate, having a first P-type well region, an N-type well region and an N-type deep well region, wherein the N-type deep well region is electrically connected to the first connection terminal, and the P-type substrate is electrically connected to the second connection terminal;

a second P-type well region, disposed in the N-type deep well region;

a plurality of first P+-type doped regions, respectively disposed in the first P-type well region, the N-type well region and the second P-type well region; and a plurality of first N+-type doped regions, respectively disposed in the first P-type well region, the N-type well region and the second P-type well region, and the first N+-type doped regions and the first P+-type doped regions being configured in alternation, wherein a diode is formed through the second P-type well region and the first N+-type doped region in the second P-type well region, a silicon controlled rectifier circuit is formed through the P-type substrate, the N-type well region, the first P+-type doped region in the N-type well region, the first P-type well region and the first N+-type doped region in the first P-type well region, and the diode is configured to trigger the silicon controlled rectifier circuit.

8. The ESD protection device as claimed in claim 7, wherein the first P+-type doped region and the first N+-type doped region in the first P-type well region are electrically connected to the second connection terminal, the first P+-type doped region and the first N+-type doped region in the N-type well region are electrically connected to the first connection terminal and the first P+-type doped region of the second P-type well region, and the first N+-type doped region in the second P-type well region is electrically connected to the second connection terminal.

9. The ESD protection device as claimed in claim 7, wherein the N-type well region is located between the first P-type well region and the N-type deep well region, the N-type well region is in contact with the first P-type well region, and the N-type well region is not in contact with the N-type deep well region.

10. The ESD protection device as claimed in claim 7, further comprising:

a second N+-type doped region, disposed in the N-type deep well region, and adjacent to the second P-type well region, wherein the N-type deep well region is electrically connected to the first connection terminal through the second N+-type doped region.

11. The ESD protection device as claimed in claim 7, further comprising:

a second P+-type doped region, disposed in the P-type substrate, and adjacent to the N-type deep well region, wherein the P-type substrate is electrically connected to the second connection terminal through the second P+-type doped region.

* * * * *